US006972612B2

(12) United States Patent
Kang et al.

(10) Patent No.: US 6,972,612 B2
(45) Date of Patent: Dec. 6, 2005

(54) SEMICONDUCTOR DEVICE WITH MALFUNCTION CONTROL CIRCUIT AND CONTROLLING METHOD THEREOF

(75) Inventors: Sang-Seok Kang, Kyungki-do (KR); Kyeong-Seon Shin, Kyungki-do (KR); Ki-Sang Kang, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/277,573

(22) Filed: Oct. 21, 2002

(65) Prior Publication Data

US 2003/0065994 A1    Apr. 3, 2003

Related U.S. Application Data

(63) Continuation-in-part of application No. 09/597,792, filed on Jun. 20, 2000, now abandoned.

(30) Foreign Application Priority Data

Jun. 22, 1996    (KR) ............... 10-1999-0023426

(51) Int. Cl.[7] ............... H01H 37/76; H01H 85/00
(52) U.S. Cl. ............... 327/525; 365/225.7
(58) Field of Search ............... 327/525–526; 365/225.7, 226

(56) References Cited

U.S. PATENT DOCUMENTS

| | | | |
|---|---|---|---|
| 4,480,199 A | 10/1984 | Varshney et al. | 327/525 |
| 4,593,203 A * | 6/1986 | Iwahashi et al. | 327/525 |
| 4,638,189 A | 1/1987 | Geannopoulos et al. | 326/37 |
| 4,903,111 A | 2/1990 | Takemae et al. | 257/209 |
| 5,058,059 A | 10/1991 | Matsuo et al. | 365/96 |
| 5,703,510 A | 12/1997 | Iketani et al. | 327/143 |
| 5,719,878 A | 2/1998 | Yu et al. | 371/22.3 |
| 5,802,007 A | 9/1998 | Kondo | 365/230.06 |
| 5,973,549 A | 10/1999 | Yuh | 327/541 |
| 6,021,075 A | 2/2000 | Ueno | 365/200 |
| 6,035,430 A * | 3/2000 | Taniguchi | 714/724 |
| 6,201,432 B1 | 3/2001 | Lim et al. | 327/525 |
| 6,261,937 B1 * | 7/2001 | Tobben et al. | 438/601 |

* cited by examiner

Primary Examiner—Quan Tra
(74) Attorney, Agent, or Firm—Marger Johnson & McCollom, P.C.

(57) ABSTRACT

An integrated circuit of a semiconductor device has a chip malfunction controlling circuit embedded in a chip. The circuit comprises a fusing part, to which a cutting will be made in the manufacturing process according to the result of the discrimination of a defect in a chip, with one end thereof being connected to a first power terminal. A signal generating part is connected to the other end of the fusing part, and to a second power terminal. The signal generating part generates a discrimination signal of discriminating whether the chip is defective or not, by whether the fusing part has been cut or not. The discrimination signal is supplied to at least one internal function circuit, and inhibits its operation if the fusing part has been cut. Furthermore, the chip malfunction controlling method comprises generating a discrimination signal that has a first state if a test fuse has been cut and a second state if the test fuse has not been cut. Then the discrimination signal is applied to the chip internal function circuits, to inhibit their operation if the fuse has been cut.

6 Claims, 6 Drawing Sheets

SEMICONDUCTOR DEVICE WITH MALFUNCTION CONTROL CIRCUIT AND CONTROLLING METHOD THEREOF

CROSS REFERENCE TO RELATED APPLICATIONS

This application claims priority from Korean Priority Document No. 99-23426, filed on Jun. 22, 1999 with the Korean Industrial Property Office, which document is hereby incorporated by reference. This application is a continuation-in-part of U.S. patent application Ser. No. 09/597,792 now abandoned, and claims the benefit of the filing date of that application.

BACKGROUND OF THE INVENTION

1. Field of the Invention

The present invention relates to a semiconductor device, and more particularly to an integrated circuit of a semiconductor device having a chip malfunction controlling circuit, and a method for inhibiting operation of the components of a chip that was formerly deemed defective.

2. Description of the Prior Art

In general, semiconductor device manufacturers carry out an electrical test to all chips, to check that an integrated circuit of wafer level chip or package level chip can reliably perform its preset operations. Such electrical test is classified into a DC parameter test, for checking the properties of the semiconductor device like current or voltage and a dynamic test for checking the operational functions of the device.

The chip tested at the wafer level can be classified into a non-defective product and a defective product according to the result of the test. At this time, some of the defective products can be repairable as spares to be used as redundancy parts, thereby improving the yield rate of final products. Then, another test is performed to the repaired chips to screen out final defective chips. In the aforementioned manners, chips have been tested and repaired in the process of manufacturing a semiconductor device, which is called an electrical die sorting (EDS) process. This EDS process has been required for repairing chips, taking an early feedback step to a defective lot and removing a defective chip as early as possible, thereby reducing packaging cost in the following assembling process or testing cost in the following package level inspection line. After completion of the EDS process, each chip is split by a sawing process, cut out according to each wafer cutting line and assembled in the following processes.

On the other hand, the following package level tests are generally performed: an on/off test to detect any defect in wires that may have occurred in the previous EDS or other assembling processes; and a burn-in test to inspect electrical properties of chips by applying stress to early remove any defective chip. According to the result of the package test, any malfunctioning chip is screened out.

On the other hand, some users do not favor the repaired chips. Their demand for a highly reliable integrated circuit usually leads to a requirement that they not be furnished with chips that were originally identified as defective, and have subsequently been repaired. The prior art seems focused on evading this requirement, instead of complying with it.

For example, a circuit for generating an identification signal has been introduced having a function of offering users information on whether the chip has been repaired or not. The circuit was disclosed by Barshney and others in U.S. Pat. No. 4,480,199, titled "Identification of repaired integrated circuits." It is intended to provide a method for a repaired circuit to behave as if it had not been previously repaired.

Figure 11:
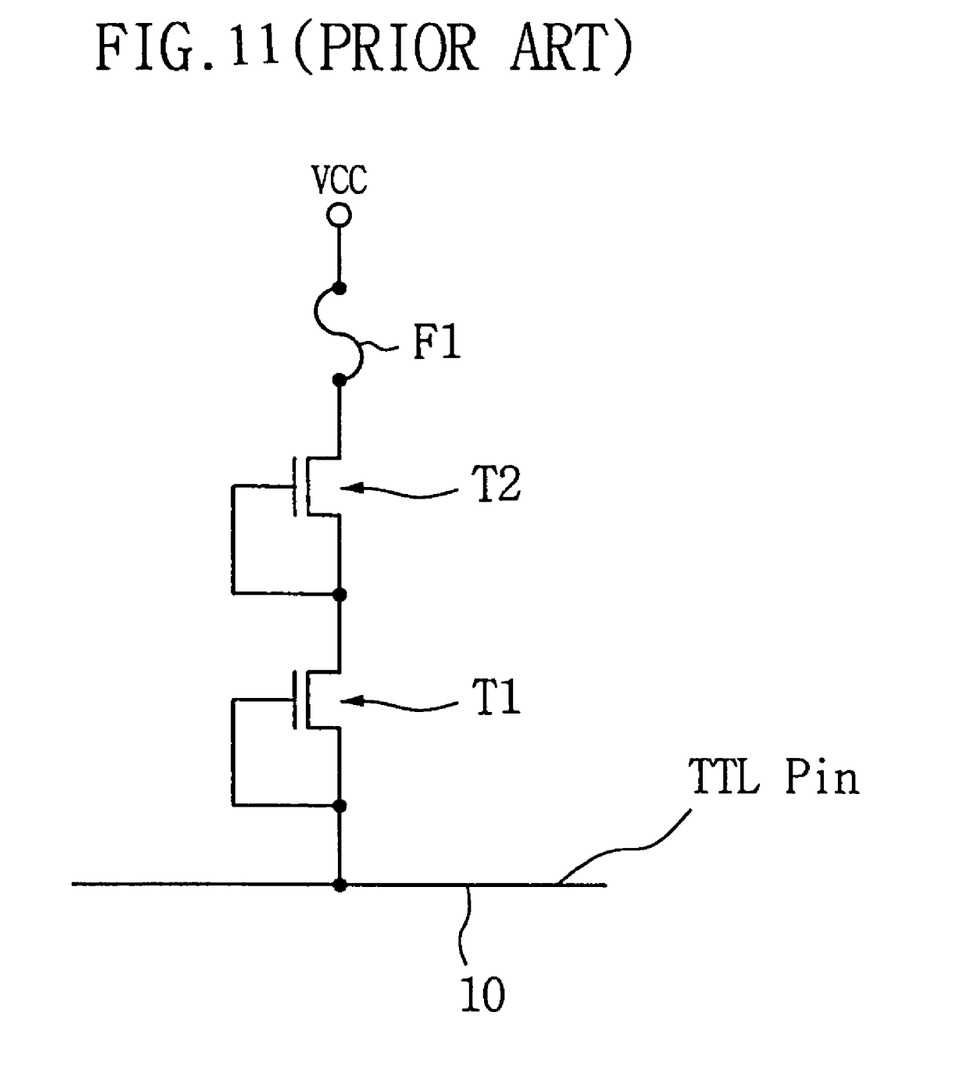
FIG. 11 is a diagram for illustrating an identification signal generating circuit included in a semiconductor device for a manufacturer to identify a repaired integrated circuit in accordance with the prior art.

FIG. 11 is a diagram for illustrating a representative circuit disclosed in previous patents, including transistors T1, T2 and a fuse F1 between a pin 10 and a supply voltage VCC. At this time, when a test voltage, higher than the voltage added with the supply voltage VCC and the threshold voltage of transistors T1, T2, is applied to the pin 10, the transistors T1, T2 turn on or off according to the prior cutting or not-cutting of the fuse F1. If the fuse F1 is cut, the transistors T1, T2 are at their OFF state, and no current flowing between the pin 10 and the supply voltage VCC will be detected. If the fuse F1 is not cut, the transistors T1, T2 are at their ON state. Therefore, current flowing between the pin 10 and the supply voltage Vcc will be detected. According to cutting or not-cutting of the fuse F1, users can discriminate whether the chip has been repaired or not. For instance, if the chip producer determined that the fuse F1 should be cut in case of a repaired chip, a user can confirm by detecting the current flowing in a chip that the chip has been repaired.

The whole point is that the manufacturer will know to test a specific pin with a specific voltage that is outside normal parameters. Indeed, that is a voltage at least two threshold voltages higher than normal, before attempting to detect current. In contrast, the end user will not know where to test and how, while the manufacturer will.

Accordingly, the aforementioned circuit makes it difficult for a repaired chip to be identified. As a result, regardless of cutting or not-cutting of the fuse F1 in the circuit, normal operations can be performed in all types of chips such as repaired chip, non-defective chip which have not been repaired, defective chip which has not been repaired, defective chip in which the normal operations may be difficult to be performed, non-defective chip which irregularly performs normal operations and defective chip which may not be repaired. If a chip determined as defective is incorrectly evaluated and assembled as a non-defective chip in the semiconductor device, it may not properly perform its functions, and may cause a fatal operational failure in the entire system.

There is a problem in the prior art in that a defective chip may be allowed to perform its normal operations in the manufacturing process that follows, or even after a final product made of the defective chip is introduced into the market. Indeed, the process for hiding from the end user the fact that a chip has been repaired may also hide it from the manufacturer. Therefore, the chip producer must balance preventing increases in production costs and harm to its business reputation. Indeed, as chips become incorporated in larger devices, the devices may malfunction from the defect.

SUMMARY OF THE INVENTION

Therefore, it is an object of the present invention to provide an integrated circuit of a semiconductor device for essentially prohibiting a defective chip from performing any operations.

It is another object of the present invention to provide a method of an integrated circuit of a semiconductor device for preventing a defective chip, which can not be repaired, from performing its normal operations in the manufacturing processes or even after its final product is placed in the market.

It is still another object of the present invention to provide a semiconductor memory device and its chip malfunction controlling method for reducing a manufacturer's burden of strict management with defective chips, for preventing any possible damage on its production cost and business image.

It is further another object of the present invention to provide a semiconductor memory or non-memory device and its chip malfunction controlling method for practically preventing a defective chip, which can not be repaired, from being approved for final sale to a consumer, even if wafer level defective chips may be sold or provided to the second producers.

In order to accomplish the aforementioned objects of the present invention, there is provided an integrated circuit of a semiconductor device having a chip malfunction controlling circuit embedded in a chip. The circuit comprises a fusing part, to which a cutting will be made in the manufacturing process according to the result of the discrimination of a defect in a chip, with one end thereof being connected to a first power terminal. A signal generating part is connected to the other end of the fusing part, and to a second power terminal. The signal generating part generates a discrimination signal of discriminating whether the chip is defective or not, by whether the fusing part has been cut or not. The discrimination signal is supplied to at least one internal function circuit, and inhibits its operation if the fusing part has been cut.

Furthermore, the chip malfunction controlling method comprises generating a discrimination signal that has a first state, if a test fuse has been cut and a second state if the test fuse has not been cut. Then the discrimination signal is applied to the chip internal function circuits, to inhibit their operation if the fuse has been cut.

According to the semiconductor device and the chip malfunction controlling method thereof, the defective chips, which cannot be repaired, are permanently prohibited from performing their normal operations in the following manufacturing processes or even after final products made of the defective chips are introduced into the market. This simplifies the burden on manufacturers to manage the defective chips, which reduces the production cost and can protect the business's reputation.

BRIEF DESCRIPTION OF THE DRAWINGS

Objects and aspects of the invention will become apparent from the following description of an embodiment with reference to the accompanying drawings in which.

DETAILED DESCRIPTION OF THE PRESENT INVENTION

Objects and aspects of the present invention will become apparent from the following detailed description of a preferred embodiment with reference to the accompanying drawings. It should be noted that the same or similar reference numerals are used for the same or similar parts in the drawings for conveniences in description and understandings.

Figure 1:
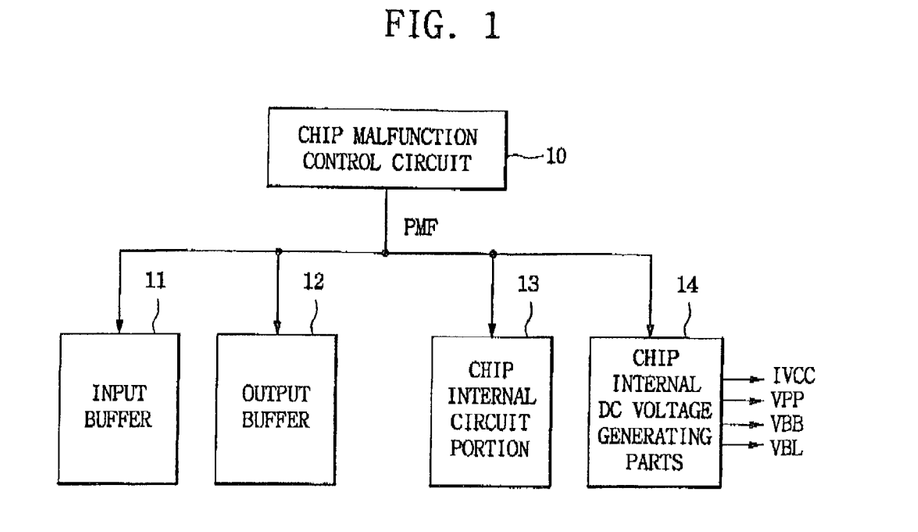
FIG. 1 is a block diagram for illustrating a semiconductor device having a chip malfunction controlling circuit in accordance with an embodiment of the present invention.

FIG. 1 is a block diagram for illustrating a semiconductor device having a chip malfunction controlling circuit in accordance with an embodiment of the present invention. A potential signal PMF (or also called a status signal) supplied from the chip malfunction controlling circuit 10 is applied to an input buffer 11, an output buffer 12, a chip internal circuit part 13 and a chip internal DC voltage generating part 14, which may be interconnected therebetween. At this time, the potential signal can be provided to at least one of those blocks of the input buffer 11, the output buffer 12, the chip internal circuit part 13 and the chip internal DC voltage generating part 14. If any one of those blocks does not properly function under the normal operational conditions of the chip, it becomes impossible for the chip to perform its normal operations.

Figure 2:
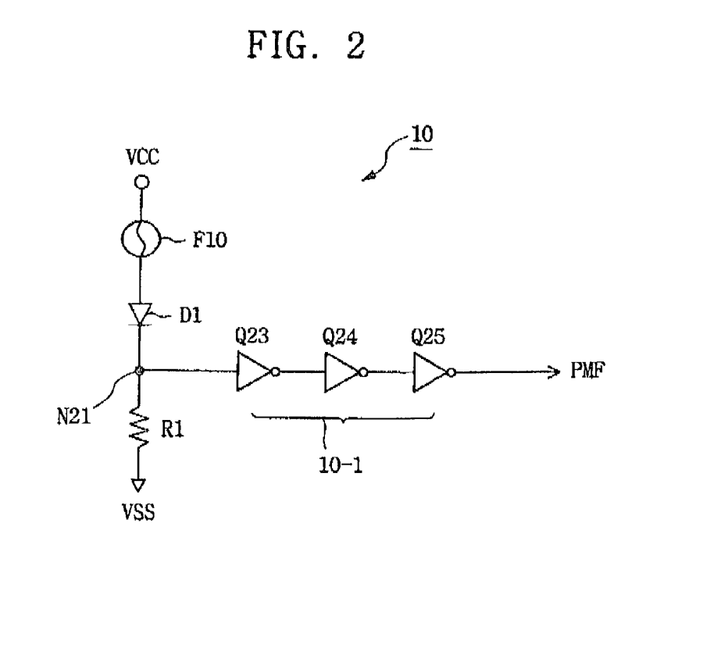
FIG. 2 shows an embodiment of the chip malfunction control circuit shown in FIG. 1.

A preferred embodiment of the chip malfunction controlling circuit 10 in FIG. 1 is illustrated in FIG. 2. As shown in FIG. 2, an end of the fuse 10 functioning as a fusing part is connected to a first power source, for instance, supply voltage VCC, and the other end of the fuse 10 is connected to an anode terminal of a diode D1. Resistance R1 is connected between a cathode terminal of the diode D1 and a second power source, for instance, grounding voltage VSS. A potential signal, also called a status signal, is obtained at a node N21, a cathode terminal of the diode D1. The status signal is a response signal in accordance with cutting or not-cutting of the fuse F10, being supplied in the form of a voltage signal. For instance, if a predetermined chip is determined as a not-repairable in the wafer level test, the fuse F10 is cut. Then, the diode D1 turns into its discontinuity state, which grounds the node N21. On the contrary, if a predetermined chip is determined as a regular non-defective chip, the fuse F10 is not cut. As a result, when supply voltage VCC is applied, the diode D1 turns to its continuity state, and a high level voltage is generated at the node N21. In the drawing, the fuse F10 can be made of polysilicon or metal, the cutting of the fuse can be made by laser beam, high current or other techniques known in the art. Preferably, it may be better that cutting of the fuse can be made by blowing laser beam, in case of the doped polysilicon fuse. In order to shape the wave form of the potential signal acquired at the node, a buffer 10-1 consisting of inverters Q23 through Q26 can be connected to the node N21. The status signal, i.e. the potential signal, indicates cutting or not-cutting of the fuse F10. If the fuse F10 is cut, then, even if supply voltage VCC is applied, a low level voltage is generated at the node N21. The low level voltage is buffered by the buffer 10-1, and output as a shaped logical low level voltage. The shaped low level voltage is a status signal for indicating a defective chip. On the contrary, if the fuse F10 is not cut, then the supply voltage VCC generates a high level voltage at the node N21. The high level voltage is buffered by the buffer 10-1, and output as a shaped logical high level voltage. The shaped high level voltage is a status signal to indicate a non-defective chip.

The status signal PMF is supplied to at least one control terminal of those blocks of the input buffer 11, the output buffer 12, the chip internal circuit part 13 and the chip internal DC voltage generating part 14.

The chip malfunction controlling circuit can be made on a semiconductor substrate by a well-known CMOS manufacturing procedure in the process of manufacturing the semiconductor memory device, which may be beneficial in production cost of the semiconductor device.

Hereinafter, it will be described how the chip malfunction controlling circuit 10 including the fusing part relevant to the fuse F10 and the signal generating part relevant to the diode D1 and the resistance R1 can control enabling or disabling operations of those parts such as the input buffer 11, the output buffer 12, the chip internal circuit part 13 and the chip internal DC voltage generating part 14.

The fuse is cut according to a prior test for a defect of the chip. The discrimination signal is generated on the chip, and has a first state if the fuse of the chip has been cut, and a second state if the fuse has not been cut. Of interest is only the first state. That is why the discrimination signal is equivalently said to be generated if the fuse has been cut, and to inhibit an operation of the internal function circuits if the fuse has been cut.

Figure 3:
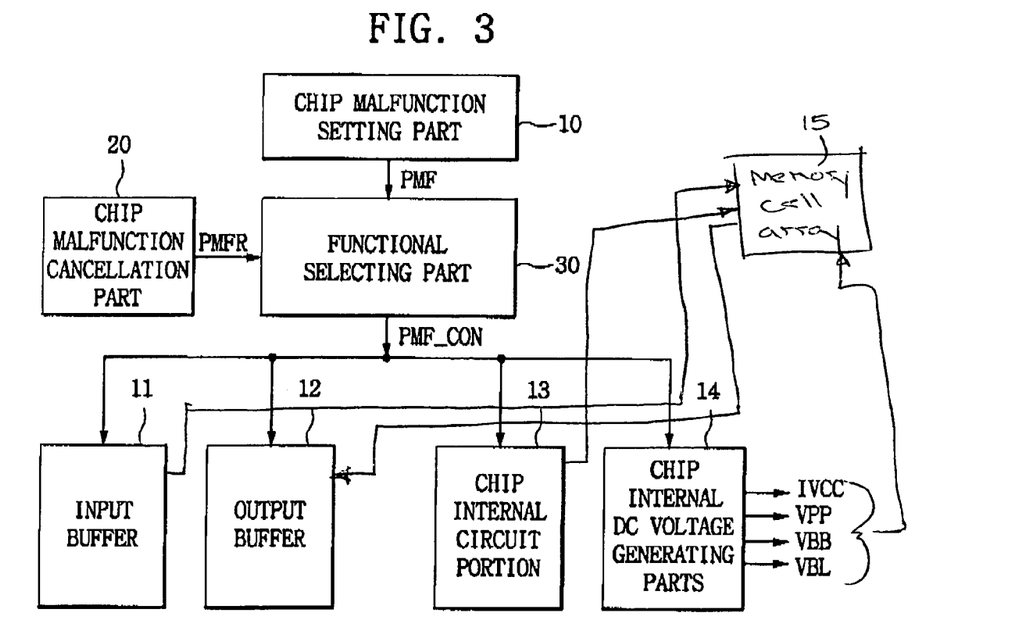
FIG. 3 is a block diagram of a semiconductor device having a chip malfunction cancellation function.

FIG. 3 is a block diagram of a semiconductor device having a chip malfunction cancellation function according to an embodiment of the present invention, which further comprises a chip malfunction cancellation part 20 and a functional selecting part 30 compared with FIG. 1. The functional selecting part 30 outputs a malfunction controlling signal PMF_CON for allowing bypass of the malfunction setting signal PMF for setting the chip malfunction or allowing setting of the chip malfunction in response to a state of the malfunction cancellation signal PMFR that is generated from the chip malfunction cancellation part 20.

In FIG. 3, the chip malfunction setting part 10 corresponds to the first set of programming circuitry, the chip malfunction cancellation part 20 corresponds to the second set of programming circuitry, and the functional selecting part 30 corresponds to the output circuitry. A first integrated circuit portion includes a memory cell array 15 for the semiconductor device. In addition, a second integrated circuit portion has a number of functional groups including an input buffer 11, an output buffer 12, a chip internal circuit 13, and a chip internal DC voltage generator 14. These functional groups are for reading the data stored in the first integrated circuit portion. The malfunction controlling signal PMF_CON may be selectively input to any one of the input buffer 11, output buffer 12, chip internal circuit portion 13 and a chip internal DC voltage generator 14, or all of them.

Figure 4:
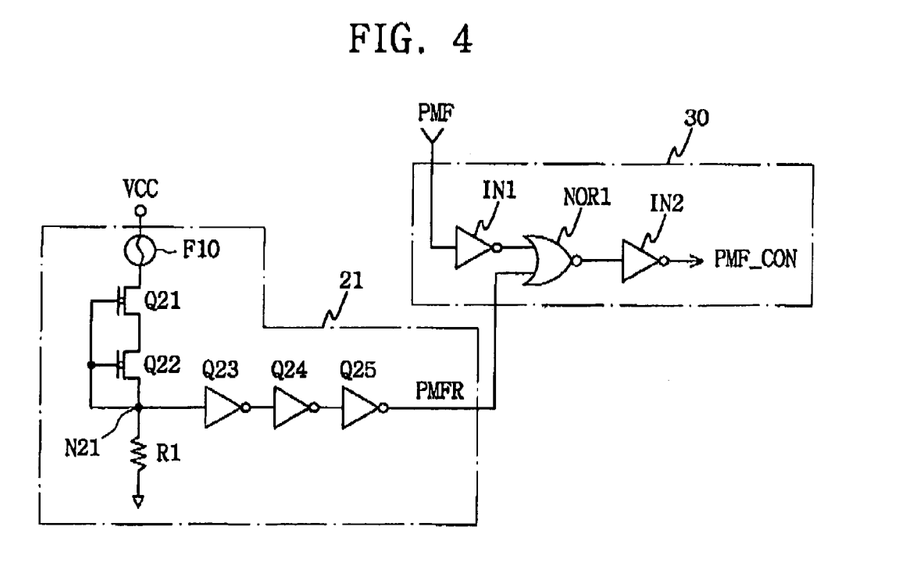
FIG. 4 is a detailed circuit diagram illustrating the chip malfunction cancellation part and functional selecting part as shown in FIG. 3 according to an embodiment of the present invention.
Figure 5:
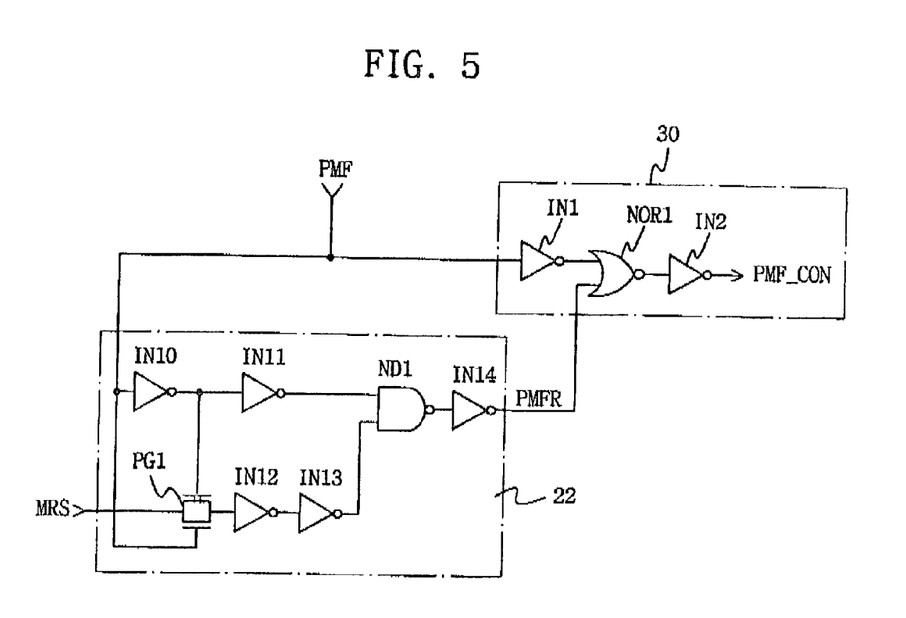
FIG. 5 is a detailed circuit diagram illustrating the chip malfunction cancellation part and functional selecting part as shown in FIG. 3 according to another embodiment of the present invention.
Figure 6:
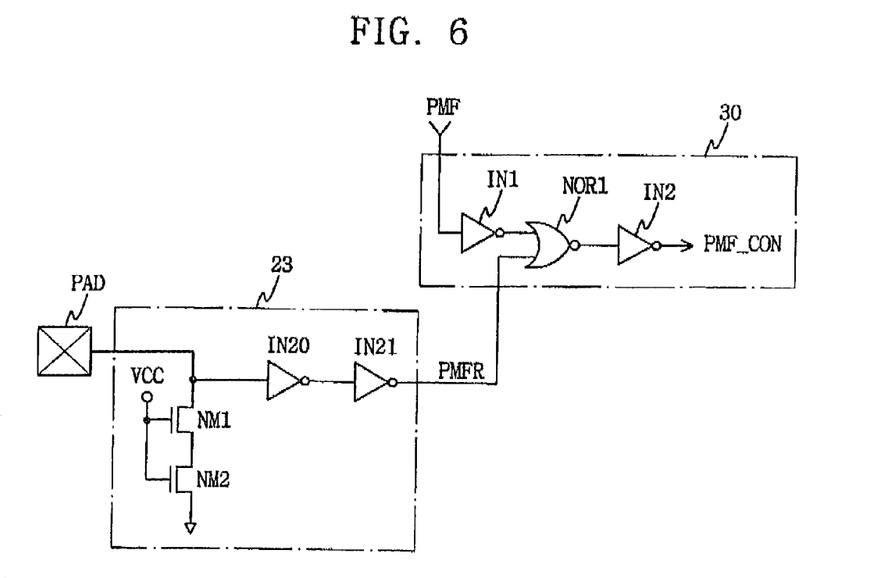
FIG. 6 is a detailed circuit diagram illustrating the chip malfunction cancellation part and functional selecting part as shown in FIG. 3 according to yet another embodiment of the present invention.

The chip malfunction cancellation part 20 may be implemented such that it generates the malfunction-cancellation signal PMFR by cutting a fuse, or by inputting the mode register set command MRS from an external side, or by applying voltage to a pad, as shown in FIGS. 4 to 6.

FIG. 4 is a detailed circuit diagram showing one implementation of the chip malfunction cancellation part and the functional selecting part as shown in FIG. 3. The chip malfunction cancellation part 21 shown in FIG. 4 includes a fuse F10 by which laser or electric current may be cut off as an embodiment. The fuse F10 is connected to power voltage VCC at one terminal thereof and connected to a source of P channel MOS transistor PMOSFET, Q21 at the other terminal. A drain of the transistor Q21 is connected to a source of another P channel MOS transistor Q22. A drain of the transistor Q22 is commonly coupled to gates of the transistors Q21, Q22. Accordingly, the transistors Q21, Q22 may operate as diodes and correspond to the diode D1 of FIG. 2 equivalently. The resistance R1 is connected between the drain terminal of the transistor Q22 and the ground voltage VSS. The malfunction-cancellation signal PMFR is practically detected at the node N21, the drain terminal of the transistor Q22. The buffer including inverters Q23 Q25 is connected to the node N21 to shape a waveform of the malfunction cancellation signal PMFR that is obtained at the node N21. In this case, the buffer may include only one inverter.

When the malfunction setting signal PMF is generated as a high level, the semiconductor device does not operate. According to an object of the present invention to restore a disabled state of the semiconductor device to an original state, the fuse F10 in the chip malfunction cancellation part 21 is cut off. Accordingly the two transistors Q21, Q22, which operate as diodes even though the power voltage VCC is applied, are turned off and low level voltage is generated at the node N21. The low level voltage is inverted by the buffer and output as a shaped waveform of high level. The high level operates as a malfunction cancellation signal PMFR for recovering a chip set as a malfunction state to a chip of an original state that was not yet set.

Where fuse F10 is not cut off and the malfunction state does not require release, the two transistors Q21, Q22 become a turned-on state and the node N21 appears as a high level voltage. The high level voltage is output as a low level by the buffer. The low level does not have a practical malfunction-cancellation function, but the malfunction-setting signal PMF operates as a malfunction signal.

In FIG. 4, the functional selecting part 30 includes an inverter IN1 for inverting the malfunction setting signal PMF, a NOR gate for receiving an output of the inverter IN1 at its one terminal and receiving the malfunction cancellation signal PMFR at the other terminal thereby generating a NOR response, and another inverter IN2 for inverting an output of the NOR gate NOR1, thereby generating the malfunction controlling signal PMF_CON. Accordingly, the malfunction setting signal PMF, which is applied as a high level by cutting off the fuse F10 of FIG. 2, is input to the functional setting part 30 and as a result the chip does not operate. In this case, when the malfunction-cancellation signal PMFR is applied as a high level, the logic level of the malfunction controlling signal PMF_CON becomes a high level, and the malfunctioned chip reverts to its previous state, that is, enabled. If the malfunction setting does not need to be released, the fuse F10 is not cut off. Thus, the functional setting part 30 receives the malfunction setting signal PMF as a high level and the malfunction-cancellation signal PMFR as a low level. As a result, all inputs of the NOR gate NOR1 become low levels and the output becomes a high level. The logic level of the malfunction controlling signal PMF_CON, output through the inverter IN2, becomes a low level, thereby maintaining the malfunction state.

Where there is a normal chip that was not set as a malfunction state, the fuse F10 does not need to be cut off. Accordingly, since the functional selecting part 30 receives both the malfunction cancellation signal PMFR and the mulfaction setting signal PMF as a low level, the logic level of the malfunction control signal PMF_CON is output as a high level. Thus, in this case, the chip remains as enabled.

In addition, in the case of a normal chip that was not set as a malfunction state, since the functional selecting part 30 receives the malfunction cancellation signal PMFR as a high level and the malfunction setting signal PMF as a low level, even though the fuse F10 was cut off, the logic level of the malfunction control signal PMF_CON is output as a high level. In this case, the chip is also at an enabled state.

The malfunction control signal PMF_CON is provided to at least one control terminal out of chip internal functional circuit portions, that is, the input buffer 11, output buffer 12, chip internal circuit portion 13, and chip internal DC voltage generating parts 14.

The circuit portion of the chip malfunction setting part 10, chip malfunction cancellation part 20, and functional selecting part 30 may be configured on a circuit board by using a well-known CMOS fabrication process. It is advantageous in the fabrication cost to make the circuit portion simultaneously when the corresponding semiconductor memory is fabricated.

Note that the term "defective chip" indicates: a chip in which a part of the memory cells in a memory cell array has a hard fail, a chip having a soft fail that satisfies AC and DC specifications in response to a test requirement, or a chip in which memory cells is normal but tested in error. The hard fail frequently occurs where shorts between adjacent lines or contact holes are clogged. This is caused by particles created during a process procedure.

FIG. 5 is a detailed circuit diagram illustrating the chip malfunction cancellation part and functional selecting part as shown in FIG. 3 according to another embodiment of the present invention. This embodiment shows that the chip malfunction cancellation part 22 receives a mode register set (MRS) command that is input from an external side, creating a malfunction cancellation signal PMFR. As shown in FIG. 5, the chip malfunction cancellation part 22 includes a transmission gate PG1 receiving the mode register set MRS command, an inverter IN10 inverting the malfunction setting signal PMF to switch the transmission gate PG1, an inverter IN11 inverting an output of the inverter IN10, an inverter IN12 inverting an output of the transmission gate PG1, a NAND gate ND1 receiving an output of inverter IN11 and an output of inverter IN13 to create a NAND response, and an inverter IN14 inverting an output of the NAND gate ND1 to create a malfunction cancellation signal PMFR.

To convert a malfunction state to a malfunction cancellation state, the MRS command is input as a high level from an external side. As a result, the two inputs of the NAND gate ND1 become high levels and an output of the NAND gate ND1 becomes a low level. The low level is converted to a malfunction cancellation signal PMFR of high level by the inverter IN14.

Accordingly, since the functional selecting part 30 receives as high levels both the malfunction cancellation signal PMFR and the malfunction setting signal PMF, the logic level of the malfunction control signal PMF_CON is output as a high level. As a result, a disabled state of that chip returns to a previous state, which is an enabled state.

If the malfunction setting does not need to be canceled or the malfunction setting needs to be set again after cancellation of the malfunction setting, the MRS command is input as a low level from an external side. The functional selecting part 30 receives the malfunction setting signal PMF as a high level and the malfunction cancellation signal PMFR as a low level. As a result, all inputs of the NOR gate NOR1 become low levels, and their outputs become high levels. Additionally, the logic levels of the malfunction control signal PMF_CON output through the inverted IN2 become low levels, and the disabled state of the malfunction function is continuously maintained, or stopped, and returns to a malfunction state again.

FIG. 6 is a detailed circuit diagram illustrating the chip malfunction cancellation part and functional selecting part as shown in FIG. 3 according to yet another embodiment of the present invention.

This embodiment shows the chip malfunction cancellation part 23 receiving a pad control signal input from a pad PAD of the chip thereby creating a malfunction cancellation signal PMFR. As shown in FIG. 6, the chip malfunction cancellation part 23 includes an N type MOS transistor NM1 and an inverter IN20 that are connected to the pad PAD, an N type MOS transistor NM2 with a drain connected to a source of NM1 and a source connected to ground, and an inverter IN21 for inverting an output of the inverter IN20 to create a malfunction cancellation signal PMFR.

To change a malfunction state of the device to a malfunction cancellation state, the pad PAD is input with a high level voltage signal. As a result, the inverter IN21 generates a malfunction cancellation signal PMFR of high level to output.

Since the functional selecting part 30 receives as high levels both the malfunction cancellation signal PMFR and the malfunction setting signal PMF, the logic level of the malfunction control signal PMF_CON is output as a high level. Thus, the chip that is in a malfunction state turns to a previous state, i.e., an enabled state.

If the malfunction set state does not need to be canceled or the malfunction state needs to be set again after cancellation of the malfunction setting, the pad PAD is output with a voltage signal of ground level, i.e. 0V. As a result, the functional selecting part 30 receives the malfunction setting signal PMF as a high level and the malfunction cancellation signal PMFR as a low level. Thus, all inputs of the NOR gate NOR1 become low levels and their outputs become high levels. The logic levels of the malfunction control signal PMF_CON that are output through the inverter IN2 become low levels and the disabled state of the malfunction function is continuously maintained, or the malfunction cancellation state returns to a malfunction state again. The malfunction state of a chip may be cancelled only while the pad is input with a high level and a defective chip is analyzed such that voltage is not applied through the pad. As a result, the defective chip is returned to a malfunction state.

Figure 7:
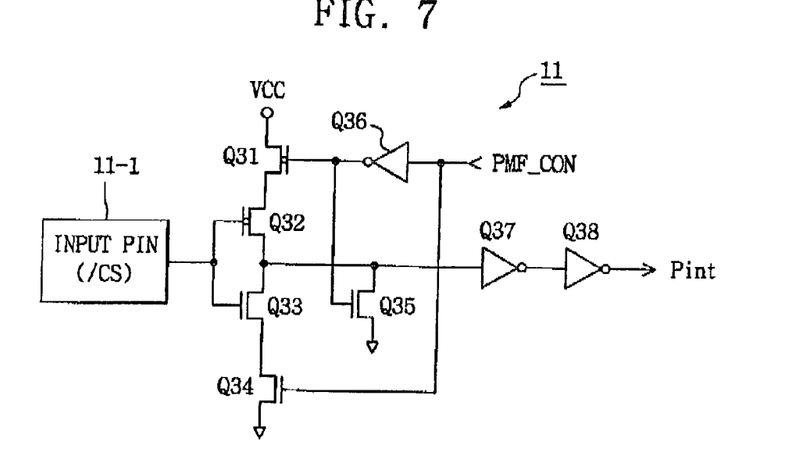
FIGS. 7 to 10 are detailed circuit diagrams illustrating each of the circuit blocks that receives malfunction control signal created in the functional selecting part in FIG. 3.

At first, FIG. 7 illustrates an embodiment of the input buffer 11 shown in FIG. 1. In the drawing, an external input signal is commonly applied through an input pin 11-1 of the semiconductor device to the gates of transistors Q32, Q33, which become clocked inverters for performing a phase-inversion of the signal. Then, the phase-inverted signal is output through a buffering inverter Q37 to an output inverter Q38. At this time, if the external input signal is a chip select signal for selecting a chip, the input pin 11-1 becomes a chip select /CS pin. The signal Pint generated by the inverter Q38 is applied to a control signal generating circuit which controls selecting a chip. The clocked inverters may additionally include transistors Q31, Q34 and a control signal inverting inverter Q35. An N channel MOS transistor Q36 functions to discharge the electric phase of an output terminal to its grounding level, if the control signal is at its first state, for instance, a low level of the signal. If the potential signal or status signal PMF generated from the chip malfunction controlling circuit 10 shown in FIG. 2 is applied as a control signal to the general input buffer 11 thus constructed, the input buffer 11 of a defective chip turns to its disabling state. In other words, if the chip is determined as defective and the status signal PMF is supplied as its low level, the transistors Q31, Q34 are kept at their OFF state. Accordingly, the transistors Q32, Q33 permanently can not perform their inversions, and lose their functions as the input buffer. As such, the discrimination signal inhibits the operation by forcing the input signal Pint to a fixed value. In contrast, if the chip is determined as non-defective and a status signal PMF is provided as its high level, the transistors Q31, Q34 are kept at their ON state. Therefore, the transistors Q32, Q33 perform their inversions, and complete their functions as the input buffer.

Even though only one signal PMF is supplied to the control terminal of the input buffer 11 in the drawing, it may be preferable that the signal PMF is applied by being merged with a control signal for enabling or disabling the input buffer. In case that the status signal PMF and the control signal are merged, it may be preferable that a logic gate to generate AND or NAND response is used as a combination logic. In consequence, the signal generating part of the chip malfunction controlling circuit 10 generates a potential signal to show one of its states according to cutting or not-cutting of the fuse to control enabling or disabling the input buffer 11. Therefore, any input buffer of the defective chip, even if it may be introduced the market, turns to its malfunction state to further cause malfunction to the entire chip.

Figure 8:
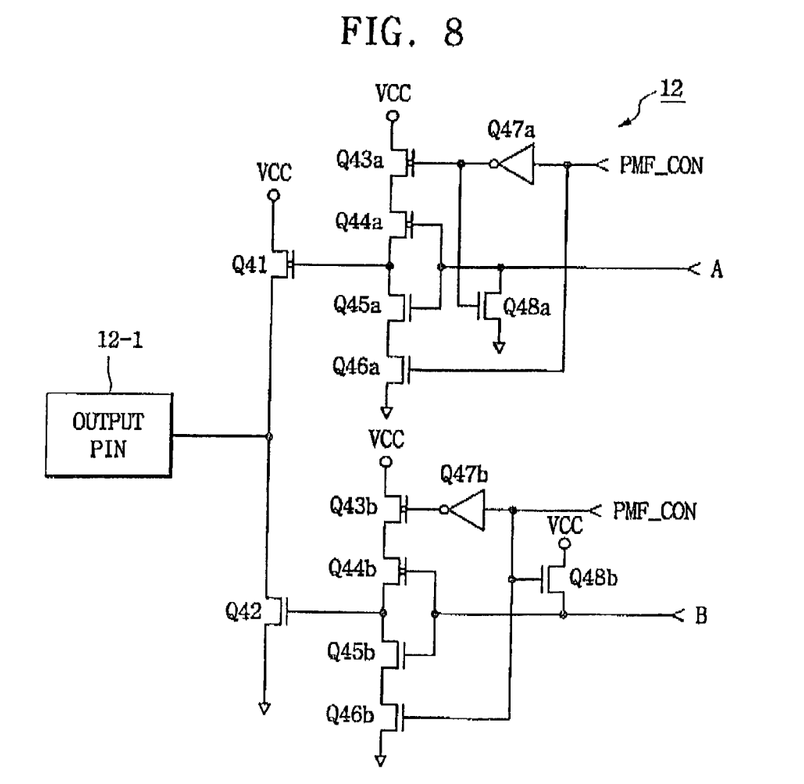

The status signal PMF can be applied to the output buffer which may operate in the controlling principle similar to the input buffer even if there may be a difference in their structure. In this case, the output buffer of the defective chip gets to its malfunction state.

As shown in the example of FIG. 8, the output buffer 12 is constructed with output driver transistors Q41, Q42, transistors Q43a, Q44a, Q45a, Q46a, Q47a to be the clocked inverters for the output control signal A, transistors Q43b, Q44b, Q45b, Q46b, Q47b to be the clocked inverters for the output control signal B, and discharging transistors Q48a, Q48b. An output pin 12-1 is connected to a common drain for the output driver transistors Q41, Q42 for supplying high or low level signal out in the process of its normal operations. If a status signal PMF is applied as a control signal to the general output buffer 12 thus constructed, the output buffer 12 of the defective chip gets to its disabling operations. In other words, if the chip is determined as defective, the status signal PMF is supplied as its low level to keep the transistors Q43a, Q46a, Q43b, Q46b at their OFF state. Thus, the two clocked inverters can never perform their inversion, thereby causing malfunction of the output buffer 12. In other words, the discrimination signal inhibits the operation by forcing the output signals A, B to fixed values. On the contrary, if the chip is determined as non-defective, the status signal PMF is applied as its high level, to keep the transistors Q43a, Q46a, Q43b, Q46b at their ON state. As a result, the inverters can perform their inversions for the signals A, B, thereby properly functioning of the output buffer 12.

Even though only one signal PMF is applied to the control terminal of the output buffer 12 in the drawing, it may be preferable that the signal PMF is applied by being merged with a control signal for enabling or disabling the output buffer. In case that the status signal PMF and the control signal are merged. It may be preferable that a logic gate to generate AND or NAND response is used as combinational logic. In consequence, the signal generating part of the chip malfunction controlling circuit 10 controls enabling or disabling the output buffer 12. Therefore, any output buffer of the defective chip, even if it may be put to the market, turns to its malfunction state to further cause malfunction to the entire chip.

Figure 9:
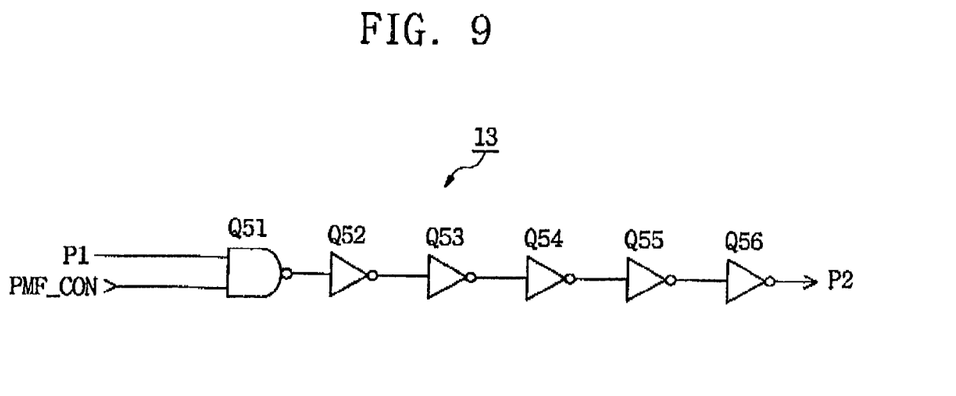

Referring to FIG. 9, a chip internal circuit part 13 uses a clock signal P1. The invention teaches to AND gate the clock signal P1 with the discrimination signal. This can be by an AND gate made from NAND gate Q51 and inverter Q52. The signal is then delayed through four inverters Q53–Q56, to output signal P2.

Similarly, if the status signal PMF is applied to the chip internal circuit part 13 of a defective chip, it can also control the chip internal circuit part 13 to turn the chip to its malfunction state. At this time, only when the first clock signal P1 is properly applied, the second clock signal P2 can be properly generated for controlling internal operations of the chip. If the status signal PMF is applied as a control signal to operate the chip internal circuit part 13, the chip internal circuit part 13 of the defective chip gets to its disabling operations. In other words, if the chip is determined as defective and the status signal PMF is applied at its low level, the output of the NAND gate Q51 is always kept at its high state, regardless of the logic level of the first clock signal P1. Therefore, the output of the inverter Q56 connected at the end of the chip internal circuit part 13 is kept at its low level, so that the chip internal circuit part 13 can not generate an output in response to the logic of the first clock signal P1. On the contrary, if the chip is determined as non-defective and the status signal PMF is applied at its high level, the NAND gate Q51 outputs a logic level to which the first clock signal P1 has been inverted. In this case, the NAND gate Q51 performs its function as an inverter. The chip internal circuit part 13 perform its function by getting the first clock signal P1 properly transmitted and processed therein.

The status signal PMF can be applied to a chip internal DC voltage generating part 14 which may operate in the controlling principle similar to the chip internal circuit part 13 even if there may be a difference in their structure. In this case, the chip internal DC voltage generating part 14 of the defective chip turns to its malfunction state. There are many kinds of chip internal DC voltage generating part 14 such as internal supply voltage generator for generating internal supply voltage IVCC, negative voltage generator for generating negative voltage VBB, half supply voltage generator for generating half supply voltage VBL (1/2VCC) and the like. However, as shown in FIG. 10, only the internal supply voltage generator 14' for generating the internal supply voltage IVCC and its controlling procedure will be described as an embodiment.

Figure 10:
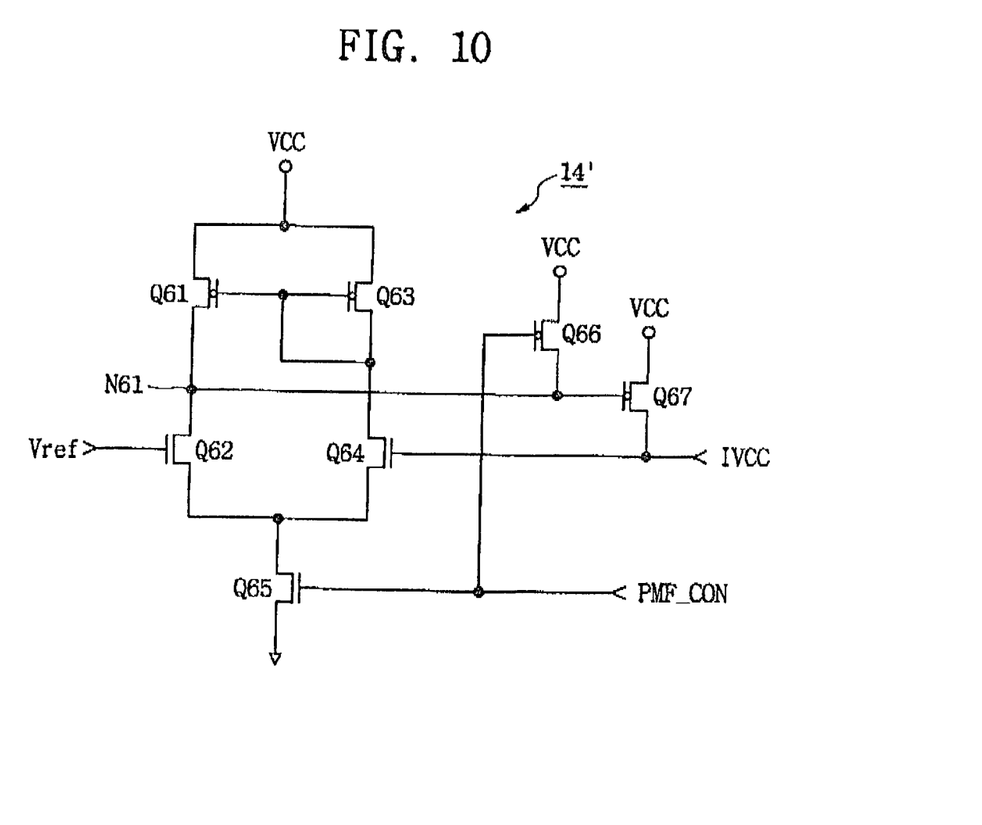

As shown in FIG. 10, the general internal supply voltage generator 14' is constructed with transistors Q61, Q62, Q63, Q64 to be current-mirror circuit, controlling transistor Q65 for enabling or disabling the current-mirror circuit, transistors Q66, Q67 with their drains respectively being connected to the output node N61, and internal supply voltage terminal IVCC for driving the current-mirror circuit.

If the status signal PMF is applied as a control signal to the internal supply voltage generator 14' of the defective chip, the internal supply voltage generator 14' gets to its disabled state. In other words, if the chip is determined as defective, the status signal PMF is applied as its low level, the transistor Q65 gets to its OFF state but the transistor Q66 gets to its ON state. Therefore, the node N61 is kept at its high state to keep the transistor Q67 at its OFF state all the time. Therefore, the internal supply voltage generator 14' can never perform the internal supply voltage generating operations by means of the current-mirror method, and never generates the internal supply voltage IVCC relevant to reference voltage Vref. In consequence, the internal supply voltage generator 14' gets to its malfunction state. On the contrary, if the chip is determined as non-defective and the status signal PMF is applied at its high level, the transistor Q65 gets to its ON state to form a current path to perform the current-mirror operations. In this case, the transistor Q66 is at its OFF state. Therefore, the internal supply voltage generator 14' properly performs its function by generating internal supply voltage relevant to its reference voltage Vref.

Even though only one signal PMF is applied to the internal supply voltage generator 14' in the drawing, it may be preferable that the signal PMF is applied by being merged with a control signal for enabling or disabling operations of the internal supply voltage generator 14'. In case that the status signal PMF and the control signal are merged, it may be preferable that a logic gate to generate AND or NAND response is used as combinational logic. In consequence, the signal generating part of the chip malfunction controlling circuit 10 controls enabling or disabling the internal supply voltage generator 14'. Therefore, any internal supply voltage generator 14' of the defective chip, even if it may be put to the market, turns to its malfunction state to further bring into malfunction of the entire chip.

While the invention has been described in terms of a preferred embodiment, those skilled in the art will recognize that the invention can be practiced with modification within the spirit and scope of the appended claims. For instance, the internal structure of the fusing part and signal generating part can be modified. The number of the transistors functioning as a diode can be increased or decreased. In case of a defective chip, the cutting may not be made at the fuse. Besides using the chip internal function circuit to generate a status signal, a written signal to indicate the defective chip can be displayed on the screen of an external device like a microprocessor or a memory controller for its controlling function or for letting the status signal recognized.

As described above, there is an advantage in the chip internal controlling circuit of the present invention in that defective chips, which cannot be repaired, are permanently prohibited from performing their normal operations in the following manufacturing processes or even after final products having the defective chips are introduced to the market. As a result chip producers can prevent increased production costs and maintain their business images while making a contribution to wafer-level chips.

What is claimed is:

1. A semiconductor device comprising:
   a first integrated circuit portion for storing data;
   a second integrated circuit portion that includes functional groups for reading the data stored in the first integrated circuit portion;
   a chip malfunction setting part structured to generate a first state when the device is defective;
   a chip malfunction cancellation part structured to generate a second state during a predetermined time in response to a pad input signal to allow bypass of the first state only during the predetermined time, the chip malfunction cancellation part including a fuse having a first terminal connected to a power supply voltage, a first transistor having a source connected to a second terminal of the fuse, and a second transistor having a source connected to a drain of the first transistor, and having a gate and a drain that are commonly connected to a gate of the first transistor; and
   a functional selecting part that is coupled to the chip malfunction setting part and the chip malfunction cancellation part, that is structured to generate an output signal in response to the first and second states, and that is structured to selectively provide the output signal directly to each of the functional groups in response to the first and second states, wherein a first level of the output signal is generated to disable a normal operation of the semiconductor device and a second level of the output signal is generated to recover a malfunctioned semiconductor device to an enable state during the predetermined time.

2. The semiconductor device of claim 1, wherein the predetermined time is set as an input time of the pad input signal.

3. A semiconductor device comprising:
   a first integrated circuit portion for storing data;
   a second integrated circuit portion that includes functional groups for reading the data stored in the first integrated circuit portion;
   a chip malfunction setting part structured to generate a first state when the device is defective;
   a chip malfunction cancellation part structured to generate a second state during a predetermined time in response to a pad input signal to allow bypass of the first state only during the predetermined time, the chip malfunction cancellation part including a first transistor having a drain connected to a pad of the semiconductor device and a second transistor having a drain connected to a source of the first transistor and having a gate commonly connected to a gate of the first transistor and to a power supply voltage; and
   a functional selecting part that is coupled to the chip malfunction setting part and the chip malfunction cancellation part, that is structured to generate an output signal in response to the first and second states, and that is structured to selectively provide the output signal directly to each of the functional groups in response to the first and second states, wherein a first level of the output signal is generated to disable a normal operation of the semiconductor device and a second level of the output signal is generated to recover a malfunctioned semiconductor device to an enable state during the predetermined time.

4. The semiconductor device of claim 3, wherein the predetermined time is set as an input time of the pad input signal.

5. A semiconductor device comprising:
   a first integrated circuit portion for storing data;
   a second integrated circuit portion that includes functional groups for reading the data stored in the first integrated circuit portion;
   a chip malfunction setting part structured to generate a first state when the device is defective;
   a chip malfunction cancellation part structured to generate a second state during a predetermined time in response to a pad input signal to allow bypass of the first state only during the predetermined time, the chip malfunction cancellation part comprising a transmission gate that is configured to pass a mode register set command and that is configured to be switched by the first state; and
   a functional selecting part that is coupled to the chip malfunction setting part and the chip malfunction cancellation part, that is structured to generate an output signal in response to the first and second states, and that is structured to selectively provide the output signal directly to each of the functional groups in response to the first and second states, wherein a first level of the output signal is generated to disable a normal operation of the semiconductor device and a second level of the output signal is generated to recover a malfunctioned semiconductor device to an enable state during the predetermined time.

6. The semiconductor device of claim 5, wherein the predetermined time is set as an input time of the pad input signal.

* * * * *